United States Patent
Harada

(10) Patent No.: US 8,309,175 B2
(45) Date of Patent: Nov. 13, 2012

(54) BARRIER FILM PRODUCING METHOD FOR A SEMICONDUCTOR

(75) Inventor: Masamichi Harada, Susono (JP)

(73) Assignee: ULVAC, Inc., Chigasaki-shi (JP)

( * ) Notice: Subject to any disclaimer, the term of this patent is extended or adjusted under 35 U.S.C. 154(b) by 0 days.

(21) Appl. No.: 13/298,347

(22) Filed: Nov. 17, 2011

(65) Prior Publication Data

US 2012/0064716 A1    Mar. 15, 2012

Related U.S. Application Data

(60) Division of application No. 12/251,793, filed on Oct. 15, 2008, which is a continuation of application No. PCT/JP2007/058311, filed on Apr. 17, 2007.

(30) Foreign Application Priority Data

Apr. 18, 2006    (JP) .................................. 2006-114789

(51) Int. Cl.
  *C23C 16/34* (2006.01)
(52) U.S. Cl. ....... 427/255.28; 427/255.39; 427/255.391; 427/255.394; 427/294
(58) Field of Classification Search ............. 427/255.28, 427/255.39, 255.391, 255.392, 255.394, 427/294
  See application file for complete search history.

(56) References Cited

U.S. PATENT DOCUMENTS

| | | | |
|---|---|---|---|
| 5,336,326 A | 8/1994 | Karner et al. | 118/723 |
| 5,384,018 A | 1/1995 | Ramm et al. | 204/192.38 |
| 6,653,212 B1 | 11/2003 | Yamanaka et al. | 438/485 |
| 2003/0091739 A1* | 5/2003 | Sakamoto et al. | 427/248.1 |
| 2004/0013803 A1* | 1/2004 | Chung et al. | 427/255.391 |
| 2005/0118810 A1* | 6/2005 | Harada et al. | 438/687 |
| 2006/0008595 A1 | 1/2006 | Ishizaka et al. | 427/569 |
| 2006/0275540 A1* | 12/2006 | Kubota | 427/66 |
| 2008/0078325 A1 | 4/2008 | Matsuda et al. | 118/723 |
| 2009/0117271 A1 | 5/2009 | Harada | 427/252 |
| 2010/0264023 A1* | 10/2010 | Takeyama et al. | 204/298.13 |

FOREIGN PATENT DOCUMENTS

| | | |
|---|---|---|
| CN | 1638052 | 7/2005 |
| EP | 0 247 783 | 12/1987 |
| JP | 2001-102444 | 4/2001 |
| JP | 2004-006856 | 1/2004 |
| JP | 2004-217966 * | 8/2004 |
| JP | 2005-158761 | 6/2005 |
| JP | 2005-179743 | 7/2005 |
| JP | 2006-028572 | 2/2006 |
| JP | 2006-057162 | 3/2006 |

OTHER PUBLICATIONS

Sato, Hidekazu, et al., "Low-k silicon nitride film for copper interconnects process prepared by catalytic chemical vapor deposition method at low temperature". Thin Solid Films 395 (2001) pp. 280-283.*

Masuda, Atsushi, et al., "Various applications of silicon nitride by catalytic chemical vapor deposition for coating, passivation and insulating films." Thin Solid Films 501 (2006) pp. 149-153.*

Sherman, A., "Growth and Properties of LPCVD Titanium Nitride as a Diffusion Barrier for Silicon Device Technology". J. Electrochem. Soc., vol. 137, No. 6, Jun. 1990, pp. 1892-1897.*

International Search Report issued on PCT/JP2007/058311 mailed Jun. 12, 2007.

First Office Action issued by the State Intellectual Property Office, P.R. China on counterpart appln. No. 200780013935.1 dated Apr. 21, 2010.

* cited by examiner

*Primary Examiner* — Bret Chen

(74) *Attorney, Agent, or Firm* — Kratz, Quintos & Hanson, LLP

(57) ABSTRACT

A film forming method for producing a barrier film for a semiconductor. A metallic material gas and a reactive gas are alternatively introduced into a vacuum chamber. A back-flow preventing gas and an auxiliary gas are also introduced into the vacuum chamber. The reactive gas and the auxiliary gas are moved with a flow of the back-flow preventing gas, and radicals are produced by being in contact with a catalytic material. The metallic material gas is not in contact with the catalytic material, and the catalytic material is not degraded. A shower plate may be disposed between a radical producing chamber and a reaction chamber, so that the radicals are fed into the reaction chamber through holes.

7 Claims, 5 Drawing Sheets

BARRIER FILM PRODUCING METHOD FOR A SEMICONDUCTOR

RELATED APPLICATIONS

This application is a division of U.S. patent application Ser. No. 12/251,793, filed Oct. 15, 2008, which application is a continuation of International Application No. PCT/JP2007/058311 filed Apr. 17, 2007, which claims priority of Japanese Patent Document No. 2006-114789, filed on Apr. 18, 2006, the entire contents of which are incorporated herein by reference.

BACKGROUND

The present invention generally relates to a film forming apparatus for use in a semiconductor-producing process and a method for producing a barrier film to be used in a semiconductor.

In the process for producing Cu wirings to be used in semiconductor devices, the film forming temperature is limited to 300 degree Celsius or less. This is the reason why when the film forming temperature is not less than 300 degrees Celsius, a phenomenon so-called stress migration (SM) occurs to the Cu wiring so that the reliability of the Cu wirings is conspicuously deteriorated.

In a conventional art, a method is carried out in which an easily pyrolyzable MO-based material is used as a metallic material gas because of that temperature limitation, and a barrier metal is obtained at 300 degrees Celsius or less by reacting it with a plasmatized reactive gas.

However, since the barrier metal obtained by this method includes many impurities (such as, C and O), only film having high specific resistance (a few hundred to several thousand μΩ cm) can be obtained. Further, since many impurities are contained, there is a problem in that adhesion between the barrier film and a Cu film as an upper layer is low. When the adhesion is low in a Cu process, the film is peeled in a CMP step, thereby resulting in a fatal defect.

This is caused by C and O being contained in a gas of an MO-based metallic material (such as, PDMAT, TDMAT) so that if a gas of an inorganic metallic material ($TiCl_4$ or $WF_6$) is used, a barrier film containing no impurities is obtained. However, there is a problem in that the gases of the inorganic metallic materials have high pyrolysis temperatures of 400 degrees Celsius or more.

When a reactive gas is plasmatized and is reacted with a gas of a metallic material, the plasma does not easily enter pores having high aspect ratio, so that even if a low-resistance film is formed on a surface of a substrate, the reaction between the metallic material gas and the plasma of the reactive gas does not proceed at the bottom face of the pore having the high-aspect ratio because the plasma of the reactive gas does not easily enter the high-aspect pores. Consequently, only the barrier films having small film thicknesses on the bottom faces could be obtained. Such barrier film has poor coverage.

On the other hand, according to an ALD method, a reaction can be carried out without using plasma. For example, according to the ALD method, tungsten nitride and titanium nitride can be obtained according to the following formulae:

(1) $WF_6 + 2NH_3 \rightarrow N + 6HF + N_2$ 

(2) $TiCl_4 + 8/6NH_3 \rightarrow TiN + 4HCl + 1/6N_2$. 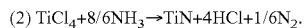

However, although the above reactions occur at 400 degrees Celsius or more, the reaction does not almost proceed at 300 degrees Celsius or less. Thus, only film having extremely high resistance (a few thousand to tens thousand .mu..OMEGA.cm) can be obtained in the case of the inorganic materials.

If radicals of the reactive gas are produced instead of the plasma, the radicals can enter the pore, so that a barrier film having good coverage can be formed. However, there is a problem in that a reaction product is deposited on a surface of a catalytic material, and the catalytic material must be frequently cleaned. These problems are disclosed in JPA 2005-158761 and JPA 2006-28572.

SUMMARY OF THE INVENTION

An object of the present invention is to provide a technique of forming a barrier film having a low resistance and excellent coverage performance and containing no impurities at a low temperature (300 degrees Celsius or less).

In order to solve the above-mentioned problems, the present invention is directed to a film forming apparatus including a vacuum chamber, a stage which is disposed in the vacuum chamber and on which an object to be film formed is placed, a catalytic material disposed away from the stage, a catalytic material heating device for heating the catalytic material, a metallic material gas-feeding system to introduce into the vacuum chamber a gas of a metallic material containing a metallic element in the chemical structure, a reactive gas-feeding system to introduce into the vacuum chamber a reactive gas which reacts with the metallic material gas to produce a metallic compound, a back-flow preventing gas-feeding system to introduce into the vacuum chamber a back-flow preventing gas which does not interrupt a reaction of the metallic compound, and a vacuum evacuation system to vacuum evacuate the interior of the vacuum chamber through an exhaust opening arranged near the stage. An introducing opening to introduce the reactive gas into the vacuum chamber and an introducing opening to introduce the back-flow preventing gas there-into are arranged farther from the stage as compared to the catalytic material, and an introducing opening to introduce the metallic material gas is arranged between the catalytic material and the stage.

Further, the present invention is directed to the film forming apparatus including an auxiliary gas-feeding system to introduce into the vacuum chamber an auxiliary gas which reacts with the metallic material gas in order to produce an intermediate product, wherein the metallic compound is produced by a reaction between the reactive gas and the intermediate product.

Furthermore, the present invention is directed to the film forming apparatus, wherein a shower plate formed with a plurality of through holes is disposed between the catalytic material and the stages and a radical-producing chamber and a reaction chamber are formed in the vacuum chamber, the catalytic material and the reactive gas-introducing opening being arranged in the radical-producing chamber, and the stage and the metallic material gas-introducing opening being arranged in the reaction chamber.

Still further, the present invention is directed to the film forming apparatus including an auxiliary gas-feeding system to introduce into the vacuum chamber an auxiliary gas which reacts with the metallic material gas to produce an intermediate product, wherein an introducing opening for the auxiliary gas-feeding system is arranged in the radical-producing chamber, and the metallic compound is produced by the reaction between the reactive gas and the intermediate product.

In addition, the present invention is directed to a barrier film-producing method for forming a barrier film composed of a metal compound containing a metallic element on a surface of an object to be film formed, including the steps of disposing a catalytic material and the object to be film formed inside a vacuum chamber and heating the catalytic material, introducing step for introducing a gas of a metallic material containing a metallic element in the chemical formula between the catalytic material and the object to be film formed, producing step for being in contact with a reactive gas to the catalytic material in order to produce radicals of the reactive gas, the reactive gas being adapted to react with the metallic material gas to produce the metallic compound, and a back-flow preventing gas which does not interrupt the production of the metallic compound is introduced into the vacuum chamber, and the metallic material gas and the reactive gas are introduced in a state such that a flow of the back-flow preventing gas is formed, flowing from a side of the catalytic material to a side of the object to be film formed.

Further, the present invention is directed to the barrier film producing method, wherein $TiCl_4$ is used as the metallic material gas, and either $NH_3$ or $SiH_4$ is used as the reactive gas.

Furthermore, the present invention is directed to the barrier film-producing method, wherein an auxiliary gas is introduced into the vacuum chamber, the auxiliary gas is in contact with the catalytic material to produce radicals of the auxiliary gas, the metallic material gas adsorbed on a surface of the object to be film formed is reacted with the radicals of the auxiliary gas in order to produce an intermediate product, and the metallic compound is produced by reacting the produced intermediate product with the reactive gas.

Still further, the present invention is directed to the barrier film-producing method, wherein an $H_2$ gas is used as the auxiliary gas.

Still further, the present invention is directed to the barrier film-producing method including disposing a shower plate formed with plural through holes between the catalytic material and the object to be film formed, thereby forming a radical-producing chamber in which the catalytic material is positioned and a reaction chamber in which the object to be film formed is positioned, introducing the metallic material gas into the reaction chamber, introducing the reactive gas and the back-flow preventing gas into the radical-producing chamber, and vacuum evacuating the gases inside the reaction chamber through an exhaust opening arranged in the reaction chamber.

Still further, the present invention is directed to the barrier film-producing method, wherein the auxiliary gas is introduced into the radical-producing chamber, radicals of the auxiliary gas are produced by being in contact with the auxiliary gas to the catalytic material, the metallic material gas adsorbed on a surface of the object to be film formed is reacted with the radicals of the auxiliary gas in order to produce an intermediate product, and the metallic compound is produced by reacting the produced intermediate product with the reactive gas.

Still further, the present invention is directed to the barrier film-producing method, wherein an $H_2$ gas is used as the auxiliary gas.

In a remote plasma method, a reactive gas is converted to highly reactive ions (plasma) with RF waves or micro waves so as to promote a reaction between a gas of a metallic material and the reactive gas. On the other hand, according to the present invention, no ions (plasma) are produced, and the highly reactive radicals are produced from the reactive gas, and reacted with the metallic material gas. Consequently, the barrier film having good coverage can be formed inside the pore.

The barrier film having a lower resistance and a lower concentration of impurities can be formed in contrast to if plasma is used.

The barrier film obtained by the present invention does not contain the impurities and has extremely good adhesion to Cu so that the film can undergo a CMP step without being peeled. In addition, the barrier film having a specific resistance of around dozens $\mu \Omega$ cm is obtained, while the specific resistance of the barrier film in the prior art is a few hundred to several thousand $\mu \Omega$ cm. Thus, a via resistance can be reduced, and a great effect is obtained for speeding up an operation speed of a device.

Because the metallic material gas is not in contact with the catalytic material, the catalytic material is not degraded, and films can be formed continuously.

DETAILED DESCRIPTION OF THE INVENTION

The present invention will be explained by using the drawings.

Figure 1:
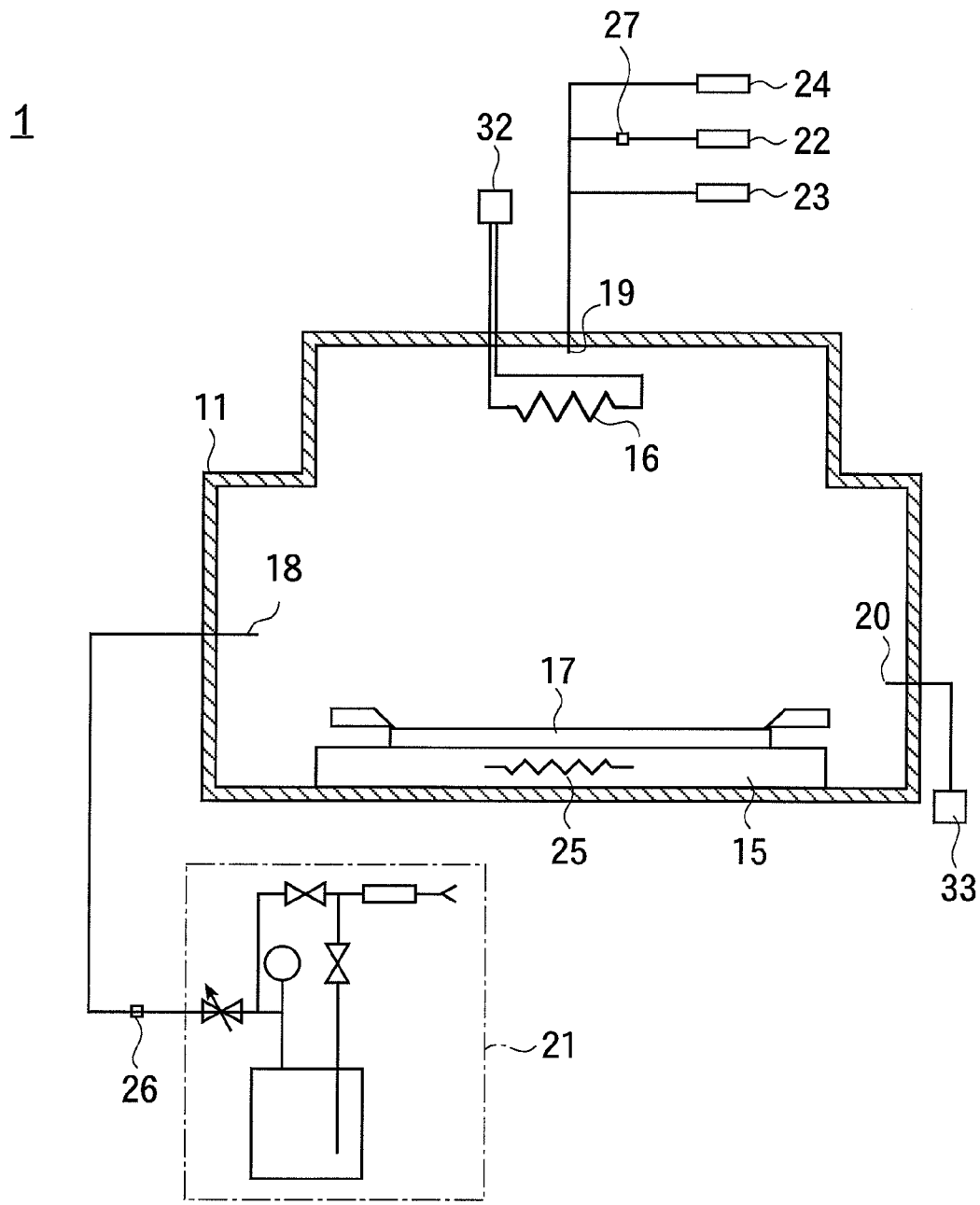
FIG. 1 shows a first embodiment of the film forming apparatus according to the present invention.

In FIG. 1, reference numeral 1 shows a film forming apparatus according to the embodiment of the present invention.

This film forming apparatus 1 has a vacuum chamber 11 and a stage 15 is disposed inside of the vacuum chamber 11. Reference numeral 17 denotes an object to be film formed, which is placed on the stage 15.

A catalytic material 16 made of a metal wire is arranged at a position facing the stage 15 inside the vacuum chamber 11.

Outside the vacuum chamber 11, a metallic material gas-feeding system 21, a reactive gas-feeding system 22, an auxiliary gas-feeding system 23 and a back-flow preventing gas-feeding system 24 are provided.

A first introducing opening 18, to which the metallic material gas-feeding system 21 is connected, is disposed at a position which is nearer to the stage 15 as compared to the catalytic material 16 and is deviated from a position immediately above the substrate stage.

On the other hand, a second introducing opening 19, to which a reactive gas-feeding system 22, an auxiliary gas-feeding system 23 and a back-flow preventing gas-feeding system 24 are connected, is disposed at a position farther from a position above the stage 15 and the object 17 to be film formed as compared to the catalytic material 16. In this embodiment, the second introducing opening 19 is disposed immediately above the stage 15. As viewed from the stage 15, the second introducing opening 19 is positioned behind the catalytic material 16.

In other words, when the surface of the stage 15 or that of the object 17 to be film formed, which is placed on the stage 15, is taken as a reference for the height, the heights of the first introducing opening 18, the catalytic material 16 and the second introducing opening 19 increase in this order.

The metallic material gas-feeding system 21, the auxiliary gas-feeding system 23 and the reactive gas-feeding system 22 have a source for the metallic material gas (for example, a liquid raw material and a bubbler), a source for the auxiliary gas and a source for the reactive gas, respectively.

The metallic material gas, which is an inorganic gas containing a metal in the chemical structure, is introduced at a position between the stage 15 and the catalytic material 16 inside the vacuum chamber 11 through the first introducing opening 18 together with a bubbler gas blown into the liquid raw material.

The auxiliary gas is a gas which reacts with the metallic material gas and produces an intermediate product containing a metal of the metallic material gas in the chemical structure. The reactive gas is a gas which reacts with the produced intermediate product and forms a metallic compound. As mentioned below, a barrier film is formed by the produced metallic compound.

The intermediate product need not be produced; and the metallic compound may be produced by directly reacting the metallic material gas with the reactive gas without using the auxiliary gas.

Further, a source for the back-flow preventing gas is disposed in the back-flow preventing gas-feeding system 24. The back-flow preventing gas is a gas which does not react with the metallic material gas, the auxiliary gas, the reactive gas or the intermediate product and does not interrupt the production of the metallic compound. An argon gas or a rare gas other than the argon gas can be used.

In this embodiment, the reactive gas, the auxiliary gas and the back-flow preventing gas are introduced through the identical second introducing opening 19. However, an introducing opening for the reactive gas-feeding system 22, that for the auxiliary gas-feeding system 23 and that for the back-flow preventing gas-feeding system 24, may be separately provided so that the reactive gas, the auxiliary gas and the back-flow preventing gas may be individually introduced into the vacuum chamber 11 through the respective introducing openings.

A vacuum evacuation system 33 is provided outside the vacuum chamber 11. An exhaust opening 20 is provided in the vacuum chamber 11; and the vacuum evacuation system 33 is connected to the exhaust opening 20; and the gases inside the vacuum chamber 11 are vacuum evacuated through the exhaust opening 20.

The exhaust opening 20 is positioned on a side opposite to the first introducing opening 18 as the stage 15 is center, and the metallic material gas is introduced through the first introducing opening 18, and flows on the object 17 to be film formed, which is placed on the stage 15, while being evacuated through the exhaust opening 20.

The second introducing opening 19 is positioned such that when the reactive gas and the auxiliary gas are introduced separately or together through the second introducing opening 19, these gases are in contact with the catalytic material 16 and thereafter reach the surface of the object 17 on the stage 15, while being vacuum evacuated from the exhaust opening 20. After the gases reach and are in contact with the surface of the object 17 to be film formed, they are evacuated through the exhaust opening 20.

Steps of forming a barrier metal by using this film forming apparatus 1 will now be explained.

A catalytic material heating device 32, which flows electric current through the catalytic material 16 so as to heat it, is disposed outside the vacuum chamber 11.

First, after the inside of the vacuum chamber 11 is vacuum evacuated to a predetermined pressure by means of a vacuum evacuation system 33, the catalytic material 16 is heated to a predetermined temperature by actuating the catalytic material heating device 32. In a case in which the catalytic material 16 is a heating wire made of a tungsten wire, it is heated to 1700 degrees Celsius or more to 1900 degrees Celsius or less. In this embodiment, the catalytic material is heated to 1750 degree Celsius.

While the vacuum state inside the vacuum chamber 11 is being maintained, the object 17 to be film formed is carried into the vacuum chamber 11, and placed on the stage 15. A heater 25 is disposed inside the stage 15, and the object 17 to be film formed is heated to a temperature of not more than 300 degrees Celsius by means of the heater 25.

When the back-flow preventing gas and the auxiliary gas are introduced into the vacuum chamber 11 through the second introducing opening 19 while vacuum evacuation is being performed, the back-flow preventing gas flows from the upstream side of the catalytic material 16 to the downstream side of the object 17 to be film formed, thereby forming the gas flow of the back-flow preventing gas.

The catalytic material 16 is positioned on the way of the gas flow so that when the auxiliary gas moves with the flow of the back-flow preventing gas and is in contact with the catalytic material 16, radicals of the auxiliary gas are produced, move with the gas flow, and flow toward the object 17 to be film formed together with the back-flow preventing gas.

When the metallic material gas is introduced through the first introducing opening 18 in a state in which the back-flow preventing gas is introduced through the second introducing opening 19, the metallic material gas moves with the back-flow preventing gas, and is carried to the surface of the object 17 to be film formed. The first introducing opening 18 is positioned between the object 17 to be film formed and the catalytic material 16. Since the back-flow preventing gas flows from the upstream side of the catalytic material 16 toward the object 17 to be film formed, the metallic material gas is push flown with the flow of the back-flow preventing gas, so that the metallic material gas does not flow toward the catalytic material 16. Therefore, the metallic material gas is not in contact with the catalytic material 16.

In this embodiment, the auxiliary gas is continuously flown together with the back-flow preventing gas, and the metallic material gas and the reactive gas are alternatively introduced in a state in which the radicals of the auxiliary gas are produced.

After either the metallic material gas or the reactive gas is introduced, the introduction of both of them is stopped and the remaining gas is evacuated before the other is introduced.

Figure 2:
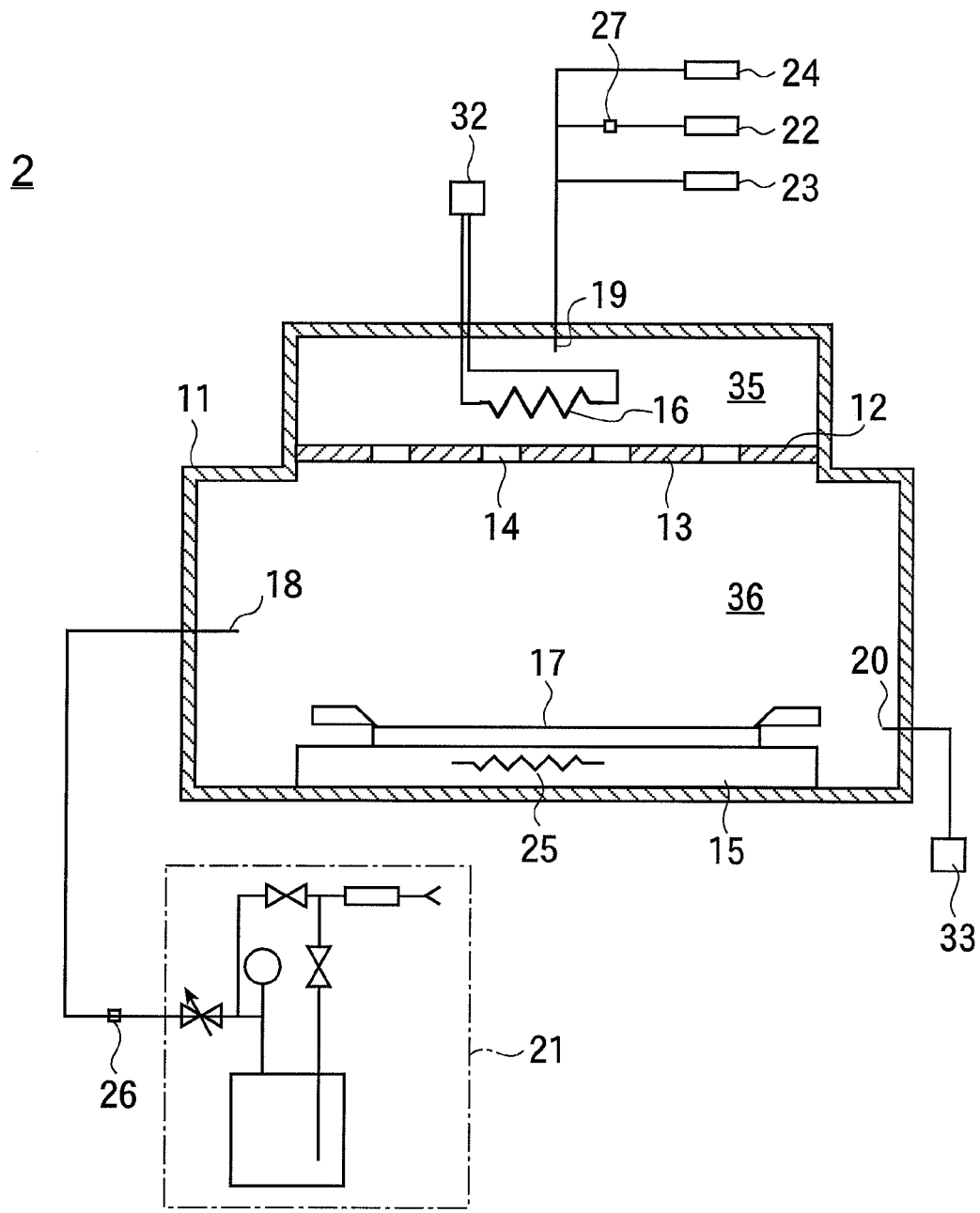
FIG. 2 shows a second embodiment of the film forming apparatus according to the present invention.

In FIG. 1 and FIG. 2, reference numeral 26 denotes a switch valve for switching between the introduction and the stoppage of the metallic material gas, and reference numeral 27 is a switch valve for switching between the introduction and the stoppage of the reactive gas.

First, only the metallic material gas is introduced without introducing the reactive gas, the metallic material gas is adsorbed onto the surface of the object 17 to be film formed. The adsorbed metallic material gas reacts with the radicals of the radicals of the auxiliary gas, thereby forming an intermediate product. Thus, the surface of the object 17 to be film formed is covered with the intermediate product.

Next, when the evacuation is carried out without the introduction of the metallic material gas or the reactive gas, the metallic material gas remaining in the vacuum chamber 11 is evacuated together with the auxiliary gas and the back-flow preventing gas. The adsorbed intermediate product remains on the surface of the object 17 to be film formed.

Next, when only the reactive gas is introduced without the introduction of the metallic material gas, the reactive gas is in contact with the catalytic material 16, and is converted to the radicals, which are transferred to the surface of the object 17 to be film formed. Then, the radicals react with the intermediate product adsorbed on the surface of the object 17 to be film formed, thereby producing the metallic compound. The barrier film made of the metallic compound is formed on the object 17 to be film formed. An excess amount of the reactive gas is exhausted through evacuation by the vacuum exhaust system 33.

Subsequently, the remaining reactive gas is evacuated without the introduction of the metallic material gas or the reactive gas.

Figure 3:
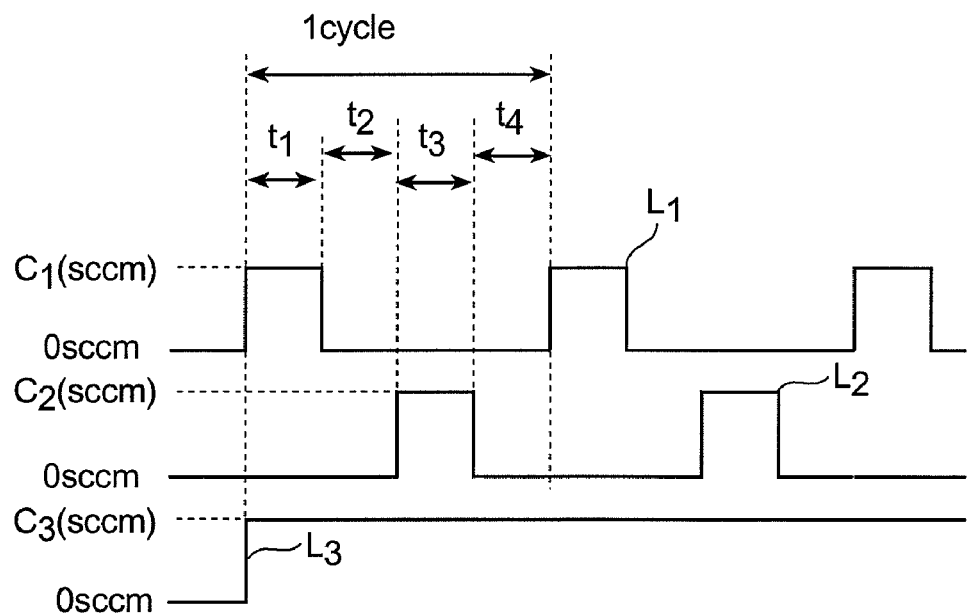
FIG. 3 shows a timing chart for explaining the barrier film forming method according to the present invention.

In the graph of FIG. 3, the abscissa denotes the time and the ordinate denotes the introducing amount (sccm); reference numerals L1, L2, L3 denote introducing times of the metallic material gas, the reactive gas and the auxiliary gas; and reference numerals t1 to t4 denote the introducing time period of the metallic material gas, the evacuating time period of the metallic material gas, the introducing time period of the reactive gas and the evacuating time period of the reactive gas.

The provision of the evacuating time periods t2 and t4 prevents the coexistence of both the metallic material gas and the reactive gas inside the vacuum chamber 11, so that the reaction can proceed with the gas adsorbed on the surface of the object 17 to be film formed.

The time periods t1 to t4 denote one cycle, and when this one-cycle operation is repeated numerous times, the barrier film having a desired film thickness can be formed on the surface of the object 17 to be film formed.

The introducing amounts of the metallic material gas, the reactive gas and the auxiliary gas are constantly $C_1$ to $C_3$ sccm, respectively. The time periods $t_1$, $t_2$, $t_3$ and $t_4$ are around 0.5 second to several seconds.

In FIG. 2, reference numeral 2 denotes a second embodiment of the film forming apparatus according to the present invention. In the film forming apparatus 2, a shower plate 12 is disposed between a catalytic material 16 and a stage 15. Since the other constituent elements are the same as those of the first embodiment of the film forming apparatus 1, same reference numerals are given to the same constituent elements, and explanation thereof is omitted.

The inner space of the vacuum chamber 11 is divided by the shower plate 12 in order to form a reaction chamber 36 in which the object 17 to be film formed on the stage 15 is positioned and a radical-producing chamber 35 in which a space around the catalytic material 16 is positioned.

The first introducing opening 18 and the exhaust opening 20 are disposed in the reaction chamber 36, and the second introducing opening 19 is disposed in the radical-producing chamber 35.

The catalytic material 16 is disposed between the second introducing opening 19 and the shower plate 12.

The shower plate 12 includes a back-flow preventing plate 13 made of a metal and at least one through hole 14 formed in the back-flow preventing plate 13. When the back-flow preventing gas, the auxiliary gas and the reactive gas are introduced into the radical-producing chamber 35, each of the gases is in contact with the catalytic material 16, the radicals of the auxiliary gas and the radicals of the reactive gas are produced, these radicals move with the flow of the back-flow preventing gas into the reaction chamber through the through holes 14, and are evacuated through the exhaust opening 20.

The flow from the radical-producing chamber 35 toward the reaction chamber 36 is formed in the through holes 14 by the back-flow preventing gas, so that the metallic material gas introduced into the reaction chamber 36 cannot move in a reverse manner through the through holes 14, or enter the radical-producing chamber 35.

In this film forming apparatus 2, the metallic material gas and the reactive gas are also alternatively introduced, while the back-flow preventing gas and the auxiliary gas are being introduced. When the gas is switched between the metallic material gas and the reactive gas, a time period during which none of the metallic material gas and the reactive gas is introduced is provided so that the metallic material gas and the reactive gas may not be co-existent in the space inside the reaction chamber 36. A film (barrier film) of the metallic compound is formed on the surface of the object 17 to be film formed.

EXAMPLES $TiCl_4$ is used as a metallic material gas, $NH_3$ is used as a reactive gas, $H_2$ is used as an auxiliary gas, Ar is used as a back-flow preventing gas, and a TiN film is formed as a barrier film. Bubbling is done by blowing Ar into a $TiCl_4$ source as a carrier gas, $TiCl_4$ is introduced into a vacuum chamber 11 together with the carrier gas. A catalytic material 16 is a tungsten wire, and heated to a temperature of 1750 degrees Celsius.

When the auxiliary gas and the reactive gas are in contact with the catalytic material 16, highly reactive radicals are produced by a catalytic action.

$H^*$ and $H_2^*$ are produced from $H_2$, whereas $NH^*$, $NH_2^*$ and $NH_3^*$ are produced from $NH_3$ (* denotes a radical).

Figure 4:
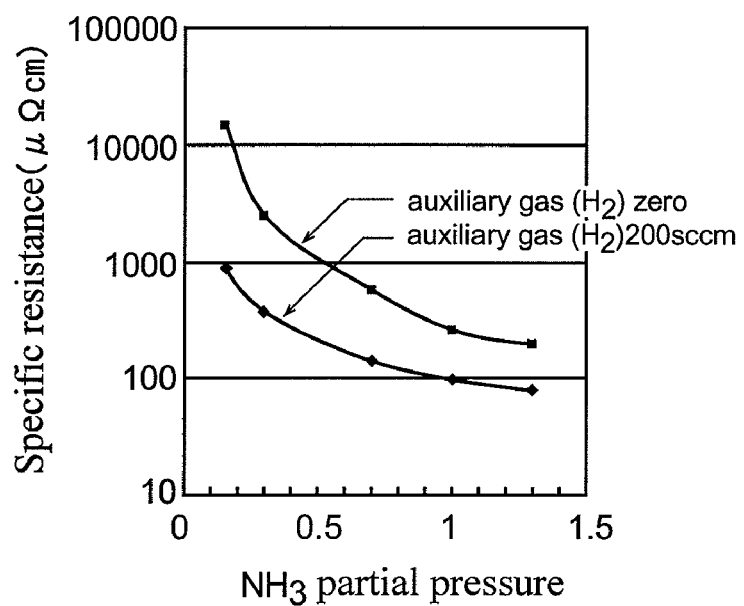
FIG. 4 is a graph for explaining the relationship between the partial pressure of $NH_3$ gas and the specific resistance.

The flow rate of the metallic material gas is set at 50 sccm, the flow rate of the auxiliary gas is set at 200 sccm or zero, the flow rate of the reactive gas is changed, and the relationship between the specific resistance of an obtained barrier film (TiN film) and the flow rate of the reactive gas is measured. Gas introducing and evacuating time periods t1 to t4 are all set at 5 seconds, and 80 cycles are performed. Results thereof are shown in FIG. 4. The abscissa denotes the partial pressure of the reactive gas ($NH_3$ gas), and the ordinate denotes the specific resistance.

Figure 6:
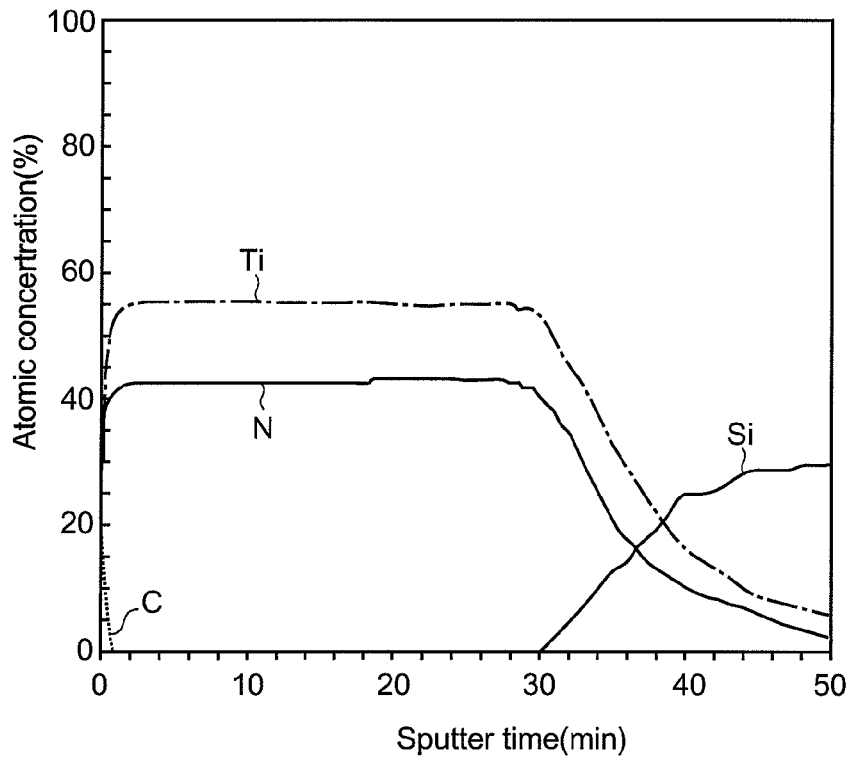
FIG. 6 shows the XPS analysis results of a TiN film.

The composition of the formed TiN film is analyzed in the film thickness direction by an XPS analysis. Results thereof are shown in FIG. 6.

It is seen from the above graph that the film having rich Ti at an N/Ti ratio of about 0.8 is obtained. Although chlorine Cl is an impurity in the metallic material gas, no chlorine is detected by the XPS analysis, which shows that the content of the chlorine is not more than the detection limit. The specific resistance is about 80.mu. but when the flow rate of $H_2$ is set at zero, the specific resistance of the film rises to 200 $\mu\Omega$ cm.

This reason is presumed as follows.

$TiCl_4$, which is adsorbed on the surface of the object 17 to be film formed by introducing the metallic material gas $TiCl_4$ into the vacuum chamber 11, is exposed to the radicals produced from the $H_2$ gas, thereby producing an intermediate product $TiCl_3$ according to the following formula:

$$TiCl_4 + H^* \rightarrow TiCl_3 + HCl \qquad (1).$$

The reaction between the intermediate product $TiCl_3$ and the $NH_3$ radicals proceeds as mentioned below:

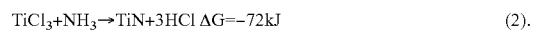

$$TiCl_3 + NH_3 \rightarrow TiN + 3HCl \; \Delta G = -72kJ \qquad (2).$$

On the other hand, if the intermediate product is not produced, a reaction proceeds as in the following formula:

$$TiCl_4 + NH_3 \rightarrow TiN + 4HCl + 1/6N \; \Delta G = -3KJ \qquad (3).$$

As the reaction more proceeds to the right side, a thin film containing more Ti is obtained. The reaction is likely to proceed to the right side as the absolute value of AG is greater with the AG being negative. Therefore, the film containing more Ti and being richer in Ti than the stoichiometric proportion N/Ti=1 is obtained in a case where the auxiliary gas is introduced to produce the intermediate product $TiCl_3$. The TiN film having a higher rate of Ti has a lower specific resistance. In the present invention, a TiN film having N/Ti=0.8 is obtained.

When no auxiliary gas is introduced, the intermediate product $TiCl_3$ is not produced, so that the compound absorbed on the surface of the substrate remains as $TiCl_4$. Since the absorbed metallic material gas $TiCl_4$ reacts with the $NH_3$ radicals, the TiN is of the stoichiometric proportion, and no reduction in the specific resistance is observed.

Although $NH_3$ gas is used as the reactive gas in the above Example, a different kind of a barrier film can be formed from the same metallic material gas when the reactive gas is changed.

As an example thereof, a barrier film is formed with the same gases under the same film forming condition except that $SiH_4$ is used as the reactive gas. The barrier film composed of $TiSi_x$ is formed.

Figure 7:
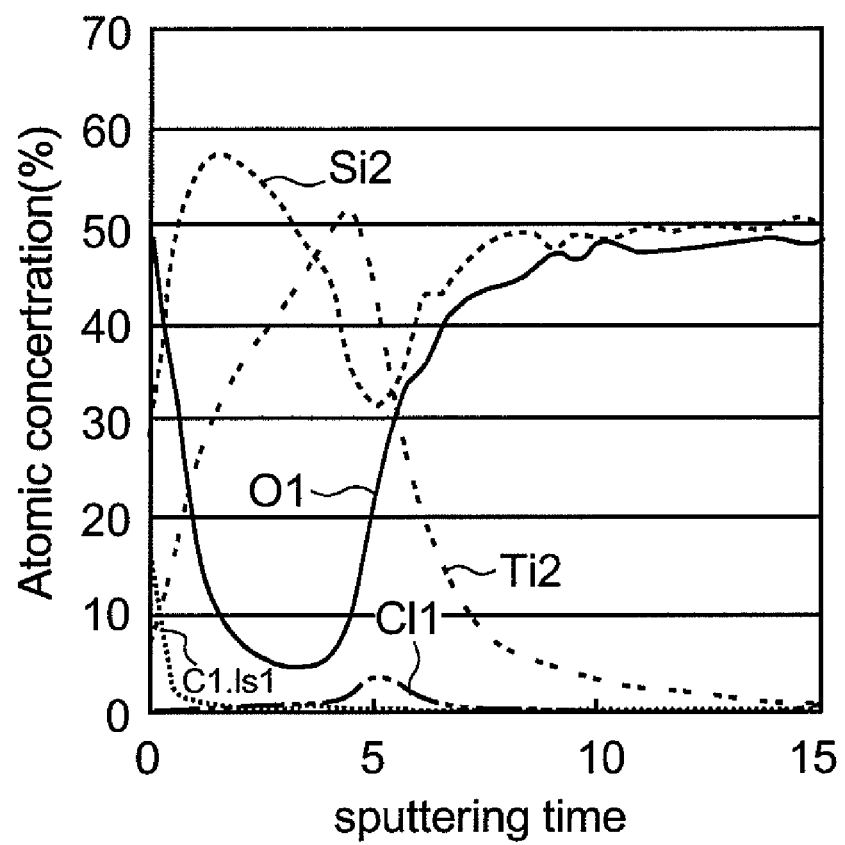
FIG. 7 shows the AES analysis results of a TiSix film.

AES analysis results of that barrier film are shown in a graph of FIG. 7. It is seen that $SiH_4$ radicals ($SiH_4^*$, $SiH_3^*$, etc.) are produced by introducing $SiH_4$, and that the thin film of $TiSi_x$ is formed.

Figure 5:
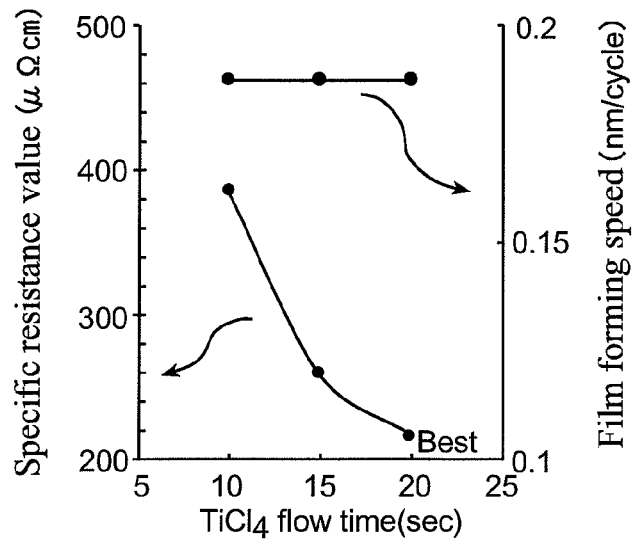
FIG. 5 is a graph showing the relationship between the flow rate of $TiCl_4$, the specific resistance and the film forming rate.

FIG. 5 is a graph showing the relationship between the flow rate of $TiCl_4$ and the specific resistance and the film forming speed.

In addition, the metallic material gas can be changed. For example, different kinds of barrier films (such as, a WN film, TaN, etc.) can be formed by using metallic material gases of different metals.

In the above, the introduction of the metallic material gas->the evacuation->the introduction of the reactive gas->the evacuation->the introduction of the metallic material gas—are repeatedly performed in a state in which the auxiliary gas is introduced. However, it may be that the introduction of the auxiliary gas is stopped, the metallic material gas is introduced, and thereafter the auxiliary gas is introduced before the reactive gas is introduced. In this case, the introduction of the metallic material gas->evacuation->the introduction of the auxiliary gas->the evacuation->the introduction of the reactive gas->evacuation are repeatedly performed.

Furthermore, in the above film forming apparatuses 1 and 2, the catalytic material 16 is arranged on the ceiling side, whereas the stage 15 is arranged on the bottom plate side thereunder. However, it may be that the stage 15 is arranged on the ceiling side, and the catalytic material 16 is arranged on the bottom plate side thereunder.

Meanwhile, the inorganic gases are used by way of example in the above discussions, but the film forming apparatuses 1 and 2 can also use organic material gases containing high melting point metals such as Ti $(Me_2)_4$, $W(CO)_6$, TIMATA or the like as the material gases besides inorganic material gases containing high melting metal (such as, $TiCl_4$, $WF_6$, $TaCl_4$ or the like).

Films of silicides (such as $TiSi_x$, $WSi_x$, $TaSi_x$ or the like) and metal nitride compounds (such as, TiN, WN, TaN or the like) as the metallic compounds constituting the barrier films can be formed.

Although the films of the metal nitride compounds are produced in the above examples by using the $NH_3$ gas, films of metal nitride compounds can be formed by using an $N_2$ gas in place of the $NH_3$ gas and producing radicals of the $N_2$ gas.

Furthermore, not only are the barrier films composed of the metallic compounds but metallic films of Ti, W, Ta or the like can also be formed.

In the above examples, the metallic catalyst which is composed of the tungsten metal and is formed in the wire-like shape is used as the catalytic material. The shape of the catalytic material is not limited to the wire-like shape, and it may be in such a shape that the radicals produced by being in contact with the reactive gas can move toward the object to be film formed.

Furthermore, the catalytic material is not limited to tungsten metal, and the catalytic material includes non-metallic materials which produce radicals when the reactive gas is in contact with the heated catalytic material, in addition to the metal catalysts (such as, metal Ta, metal Ti, metal Ir, metal Ru or the like). When the metal Ta, the metal Ti, the metal Ir or the metal Ru is used as the catalytic material, it may be that the catalytic material is used in a state in which it is heated in the range of 1000 degrees Celsius or more to 2000 degrees Celsius or less.

What is claimed is:

1. A barrier film producing method for forming a barrier film composed of a metal compound containing a metallic element on a surface of an object to be film formed, comprising the steps of:

disposing a catalytic material and the object to be film formed inside a vacuum chamber and heating the catalytic material;

an introducing step for introducing a gas of a metallic material, containing a metallic element in the chemical structure, between the catalytic material and the object to be film formed;

a producing step for contacting a reactive gas with the catalytic material in order to produce radicals of the reactive gas, the reactive gas being adapted to react with the metallic material gas to produce the metallic compound;

repeating the introducing step and the producing step, wherein a back-flow preventing gas, which does not react with the metallic material gas or the reactive gas, is introduced into the vacuum chamber, and the metallic material gas and the reactive gas are introduced during a flow of the back-flow preventing gas in a state such that the flow of the back-flow preventing gas is formed, flowing from a side of the catalytic material to a side of the object to be film formed.

2. The barrier film producing method according to claim 1, wherein $TiCl_4$ is used as the metallic material gas, and one of $NH_3$ and $SiH_4$ is used as the reactive gas.

3. The barrier film producing method according to claim 1, wherein an auxiliary gas is introduced into the vacuum chamber, the auxiliary gas is in contact with the catalytic material to produce radicals of the auxiliary gas, the metallic material gas adsorbed on a surface of the object to be film formed is reacted with the radicals of the auxiliary gas in order to produce an intermediate product, and the metallic compound is produced by reacting the produced intermediate product with the reactive gas.

4. The barrier film producing method according to claim 3, wherein an $H_2$ gas is used as the auxiliary gas.

5. The barrier film producing method set forth in claim 1, further comprising the steps of:

disposing a shower plate in which a plurality of through holes are formed between the catalytic material and the object to be film formed, thereby forming a radical-producing chamber in which the catalytic material is positioned and a reaction chamber in which the object to be film formed is positioned;

introducing the metallic material gas into the reaction chamber, and introducing the reactive gas and the backflow preventing gas into the radical-producing chamber; and vacuum evacuating the gases inside the reaction chamber through an exhaust opening arranged in the reaction chamber.

6. The barrier film producing method according to claim 5, wherein the auxiliary gas is introduced into the radical-producing chamber, radicals of the auxiliary gas are produced by being in contact with the auxiliary gas to the catalytic material, the metallic material gas adsorbed on a surface of the object to be film formed is reacted with the radicals of the auxiliary gas in order to produce an intermediate product, and the metallic compound is produced by reacting the produced intermediate product with the reactive gas.

7. The barrier film producing method according to claim 6, wherein an $H_2$ gas is used as the auxiliary gas.

* * * * *